United States Patent
Stone et al.

(10) Patent No.: US 12,356,798 B2
(45) Date of Patent: Jul. 8, 2025

(54) STRUCTURE FOR EMITTING LIGHT, LIGHT-EMITTING DIODE (LED), AND METHOD OF MANUFACTURING A STRUCTURE FOR EMITTING LIGHT

(71) Applicants: Nextgen Nano Limited, London (GB); North Carolina State University, Raleigh, NC (US)

(72) Inventors: Matthew Stone, London (GB); Franky So, Cary, NC (US); Qi Dong, Raleigh, NC (US); Liping Zhu, Raleigh, NC (US)

(73) Assignees: Nextgen Nano Limited, London (GB); North Carolina State University, Raleigh, NC (US)

( * ) Notice: Subject to any disclaimer, the term of this patent is extended or adjusted under 35 U.S.C. 154(b) by 270 days.

(21) Appl. No.: 17/471,276

(22) Filed: Sep. 10, 2021

(65) Prior Publication Data

US 2023/0081196 A1   Mar. 16, 2023

(51) Int. Cl.
*H01L 51/52* (2006.01)
*H01L 51/56* (2006.01)
*H10K 50/80* (2023.01)
*H10K 50/852* (2023.01)
*H10K 71/00* (2023.01)
*G02B 5/18* (2006.01)

(52) U.S. Cl.
CPC ........ *H10K 50/868* (2023.02); *H10K 50/852* (2023.02); *H10K 71/00* (2023.02); *G02B 5/18* (2013.01)

(58) Field of Classification Search
CPC .... H10K 50/85; H10K 50/852; H10K 50/868; H10K 59/875; H10K 59/876; H10K 59/8793
See application file for complete search history.

(56) References Cited

U.S. PATENT DOCUMENTS

| | | | |
|---|---|---|---|
| 2009/0153029 A1* | 6/2009 | Khalfin | H10K 50/854 257/E31.127 |
| 2010/0219427 A1* | 9/2010 | Fukuda | H10K 50/852 257/89 |
| 2012/0248402 A1* | 10/2012 | Rapaport | H10K 50/115 257/E33.056 |
| 2015/0131942 A1* | 5/2015 | Xu | G02B 6/305 385/37 |
| 2021/0020867 A1* | 1/2021 | Forrest | H10K 50/852 |

(Continued)

OTHER PUBLICATIONS

X. Fu et al, Directional Polarized Light Emission from Thin-Film Light-Emitting Diodes, published Jan. 29, 2021, Advanced Materials, vol. 33, Article No. 2006801, all pages. (Year: 2021).*

(Continued)

*Primary Examiner* — Victoria K. Hall
(74) *Attorney, Agent, or Firm* — NK Patent Law

(57) ABSTRACT

A structure for emitting light is provided. The structure comprises an emissive layer (EML) positioned between electrodes. The EML is tuned such that emission of a transverse electric (TE) waveguide mode from the EML is promoted. The structure further comprises an optical component for diffracting the TE waveguide mode to emit light from the structure.

13 Claims, 9 Drawing Sheets

(56) References Cited

U.S. PATENT DOCUMENTS

2023/0292542 A1* 9/2023 Park .................... H10K 50/828
257/40

OTHER PUBLICATIONS

Jagt, H. J. B., et al. "Linearly polarized light-emitting backlight." Journal of the SID, vol. 10, No. 1, 2002, p. 107-112. Society for Information Display.

Leidtke, Alicia, et al. "White-Light OLEDs Using Liquid Crystal Polymer Networks." Chem. Mater., vol. 20, No. 11, 2008, 3579-3586. American Chemical Society.

Haas, Harald, et al. 2020 "Optical wireless communication." Phil. Trans. R. Soc. A 378: 20200051 (11 pages). The Royal Society. http://dx.doi.org/10.1098/rsta.2020.0051.

Manousiadis, Pavlos P., et al. 2020 "Organic semiconductors for visible light communications." Phil. Trans. R. Soc. A 378: 20190186 (18 pages). The Royal Society. http://dx.doi.org/10.1098/rsta.2019.0186.

Alfalou, A and C. Brosseau. "Optical image compression and encryption methods."Advances in Optics and Photonics, vol. 1, 2009, 589-636. Optical Society of America. DOI: 10.1364/AIO, 1.000589.

Zhu, Jun, et al. "Solution-processed polarized light-emitting diodes." J. Mater. Chem. C, vol. 8, 2020, 9147-9162. The Royal Society of Chemistry. DOI: 10.1039/d0tc01639j.

Wang, Yafei, et al. "Recent progress in luminescent liquid crystal materials: design, properties and application for linearly polarised emission." J. Mater. Chem. C, vol. 3, 2015, 7993-8005. The Royal Society of Chemistry. DOI: 10.1039/c5tc01565k.

Park, Byoungchoo, et al."Polarized organic light-emitting device on a flexible giant birefringent optical reflecting polarizer substrate." Optics Express, vol. 17, No. 12, 2009, 10136-10143. Optical Society of America.

Zhou, Lei, et al. "Tailored Polarization Conversion and Light-Energy Recycling for Highly Linearly Polarized White Organic Light-Emitting Diodes." Laser & Photonics Reviews, vol. 14, 2020, 1900341 (1-9). Wiley-VCH Verlag GmbH & Co. KGaA. DOI: 10.1002/lpor.201900341.

Zou, Shi-Jie, et al. "Recent advances in organic light-emitting diodes: toward smart lighting and displays." Mater. Chem. Front., vol. 4, 2020, 788-820. The Royal Society of Chemistry and the Chinese Chemical Society. DOI: 10.1039/c9qm00716d.

Jiang, Yiran, et al. "Light-emitting diodes of colloidal quantum dots and nanorod heterostructures for future emissive displays." J. Mater. Chem. C, vol. 6, 2018, 2618-2634. The Royal Society of Chemistry. DOI: 10.1039/c7tc05972h.

Chen, Ziming, et al. "Materials photophysics and device engineering of perovskite light-emitting diodes." Reports on Progress in Physics, vol. 84, 2021, 1-45. IOP Publishing Ltd. https://doi.org/10.1088/1361-6633/abefba.

Salehi, Amin, et al. "Recent Advances in OLED Optical Design." Adv. Funct. Mater., vol. 29, 2019, 1808803 (21 pages). Wiley-VCH Verlag Gmbh & Co. KGaA. DOI: 10.1002/adfm.201808803.

Chen, Shufen, et al. "Recent Developments in Top-Emitting Organic Light-Emitting Diodes." Adv. Mater., vol. 22, 2010, 5227-5239. Wiley-VCH Verlag Gmbh & Co. KGaA. DOI: 10.1002/adma.201001167.

Barnes W.L. "Fluorescence near interfaces: The role of photonic mode density." Journal of Modern Optics, vol. 45, No. 4, 1997, 661-699. Taylor & Francis Ltd.

Fu, Xiangyu, et al. "Directional Polarized Light Emission from Thin-Film Light-Emitting Diodes." Adv. Mater., 2021, 2006801 (10 pages). Wiley-VCH GmbH. DOI: 10.1002/adma.202006801.

Schmidt, Tobias, et al. "Emitter Orientation as a Key Parameter in Organic Light-Emitting Diodes." Phys. Rev. Applied, vol. 8, No. 3, 2017, 037001 (28 pages). American Physical Society. DOI: 10.1103/PhysRevApplied.8.037001.

Graf, A., et al. "Correlating the transition dipole moment orientation of phosphorescent emitter molecules in OLEDs with basic material properties." J. Mater. Chem. C, vol. 2, 2014, 10298-10304. The Royal Society of Chemistry. DOI: 10.1039/c4tc00997e.

Saliba, Michael, et al. "Structured Organic-Inorganic Perovskite toward a Distributed Feedback Laser." Adv. Mater., vol. 28, 2016, 923-929. Wiley-VCH Verlag Gmbh & Co. KGaA. DOI: 10.1002/adma.201502608.

Fu, Xiangyu, et al. "Mode Dispersion in Photonic Crystal Organic Light-Emitting Diodes." ACS Appl. Electron. Mater., vol. 2, 2020, 1759-1767. American Chemical Society. https://dx.doi.org/10.1021/acsaelm.0c00326.

Turnbull, G. A., et al. "Relationship between photonic band structure and emission characteristics of a polymer distributed feedback laser." Physical Review B, vol. 64, 125122 (6 pages). The American Physical Society. DOI: 10.1103/PhysRevB.64.125122.

Martins, Emiliano, R., et al. "Low-Threshold Nanoimprinted Lasers Using Substructured Gratings for Control of Distributed Feedback." Adv. Optical Mater., vol. 1, 2013, 563-566. Wiley-VCH Verlag Gmbh & Co. KGaA. DOI: 10.1002/adom.201300211.

Schwab, Tobias, et al. "Coherent mode coupling in highly efficient top-emitting OLEDs on periodically corrugated substrates." Optics Express, vol. 22, No. 7, 2014, 7524-7537. Optical Society of America. DOI: 10.1364/OE.22.007524.

Park, Byoungchoo, et al. "Polarized electroluminescence from organic light-emitting devices using photon recycling." Optics Express, vol. 18, No. 19, 2010, 19824-19830. Optical Society of America.

Jagt, et al., "Linearly polarized light-emitting backlight", Journal of the Society for Information Display, 2002, pp. 107-112, vol. 10/1.

Liedtke, Alicia, et al., "White-Light OLED's Using Liquid Crystal Polymer Networks", Chemical Materials, American Chemical Society, 2008, pp. 3579-3586, vol. 20.

Haas, Harald, et al., Optical wireless communication, Philosophical Transactions A, the Royal Society Publishing, Jan. 17, 2020, pp. 1-11.

Manousiadis, Pavlos P., et al., "Organic semiconductors for visible light communications", Philosophical Transactions A, the Royal Society Publishing, Jan. 20, 2020, pp. 1-18.

Alfalou, A., "Optical image compression and encryption methods", Advances in Optics and Photonics, 2009, pp. 589-636, vol. 1, doi:10.1364/AOP.1.000589.

Zhu, Jun, et al., "Solution-processed polarized light-emitting diodes", Journal of Materials Chemistry C, Royal Society of Chemistry, 2020, pp. 9147-9162, vol. 8.

Wang, Yafei, et al., "Recent progress in luminescent liquid crystal materials: design, properties and application for linearly polarised emission", Journal of Materials Chemistry C, Royal Society of Chemistry, 2015, pp. 7993-8005, vol. 3.

Park, Byoungchoo, et al., Polarized organic light-emitting device on a flexible giant birefringent optical reflecting polarizer substrate, Optics Express, 8 June 1009, pp. 10136-10143, vol. 17, No. 12.

Zhou, Lei, et al., Tailored Polarization Conversion and Light-Energy Recycling for Highly Linearly Polarized White organic Light-Emitting Diodes, Laser and Photonics Reviews, www.lpr-journal.org,, 2020, pp. 1900341(1)-1900341(9), vol. 14, 1900341.

Zou, Shi-Jie, et al., "Recent advances in organic light-emitting diodes: toward smart lighting and displays", Materials Chemistry, Frontiers, Royal Society of Chemistry, Chinese Chemical Society, 2020, pp. 788-820, vol. 4.

Jiang, Yiran, et al., "Light-emitting diodes of colloidal quantum dots and nanorod heterostructures for future emissive displays", Journal of Materials Chemistry C, Royal Society of Chemistry, 2018, pp. 2618-2634, vol. 6.

Chem, Ziming, et al., "Materials, photophysics and device engineering of perovskite light-emitting diodes", Reports on Progress in Physics, IOP Publishing, ebooks, 2021, pp. 1-46, vol. 84, 046401.

Salehi, Amin, et al., "Recent Advances in OLED Optical Design", Advanced Fuctional Materials, www.afm-journal.de, Organic Light-Emitting Diodes, 2019, pp. 1-21, vol. 29, 1808803.

Chen, Shufen, et al., "Recent Developments in Top-Emitting Organic Light-Emitting Dlodes", Advanced Materials, Materials Views, www.advmat.de, 2010, pp. 5227-5239, vol. 22.

(56) References Cited

OTHER PUBLICATIONS

Barnes, W.L., et al., "Topical review Fluorescence near interfaces: the role of photonic mode density", Journal of Modern Optics, 1998, pp. 661-699, vol. 45, No. 4.

Fu, Xiangyu, et al.., "Directional Polarized Light Emission from Thin-Film Light-Emittng Diodes", Advanced Materials, www.advmat.de, Communication, 2021, pp. 1-10, vol. 2006801.

Schmidt, Tobias D., et al., Emitter Orientation as a Key Parameter in Organic Light-Emitting Diodes, Physical Review Applied, 2017, pp. 1-28, vol. 8, 037001.

Graf, A., et al., "Correlating the transition dipole moment orientation of phosphorescent emitter molecules in OLED's with basic material properties", Journal of Materials Chemistry C, Royal Society of Chemistry, 2014, pp. 10298-10304, vol. 2.

Saliba, Michael, et al., Structured Organic-Inorganic Perovskite toward a Distributed Feedback Laser, Advanced Materials, Materials Views, www.advmat.de, 2016, pp. 923-929, vol. 28.

Fu, Xiangyu, et al., "Mode Dispersion in Photonic Crysal Organic light-Emitting Diodes", ASC Applied Electronic Materials, 2020, pp. 1759-1767, vol. 2.

Turnbull, G.A., et al., "Relationship between photonic band structure and emission characteristics of a polymer distributed feedback laser", Physical Review B, The American Physical Society, 2001, pp. 1-6, vol. 64 125122.

Martins, Emiliano R., et al., "Low-Threshold Nanoimprinted Lasers Using Substructured Gratings for Control of Distributed Feedback", Advanced Optical Materials, Materials Views, www.advopticalmat.de, 2013, pp. 563-566, vol. 1.

Schwab, Tobias, et al., Coherent mode coupling in highly efficient top-emitting OLEDs on periodically corrugated substrates, Optics Express, Apr. 7, 2014, pp. 7524-7537, vol. 22, No. 7 DOI:10.1364/OE.22.007524.

Park, Byoungchoo, et al., "Polarized electroluminescence from organic light-emitting devices using photon recycling", Optics Express, Sep. 13, 2010, pp. 19824-19830, vol. 18, No. 19.

Dun Qiao, et al., "Design and optical characterization of an efficient polarized organic light emitting diode based on refractive index modulation in the emitting layer," Optics Express, vol. 28, No. 26, published Dec. 18, 2020, 14 pages.

Matthew P. Aldred, et al., "Linearly polarised organic light-emitting diodes (OLEDs): synthesis and characterisation of a novel hole-transporting photoalignment copolymer", Journal of Materials Chemistry, 15, 3208-3213, published 2005, 6 pages.

Thomas Hofler, et al., "Modifying the Output Characteristics of an Organic Light-Emitting Device by Refractive-Index Modulation", Advanced Functional Materials, 2369-2373, published 2006, 5 pages.

\* cited by examiner

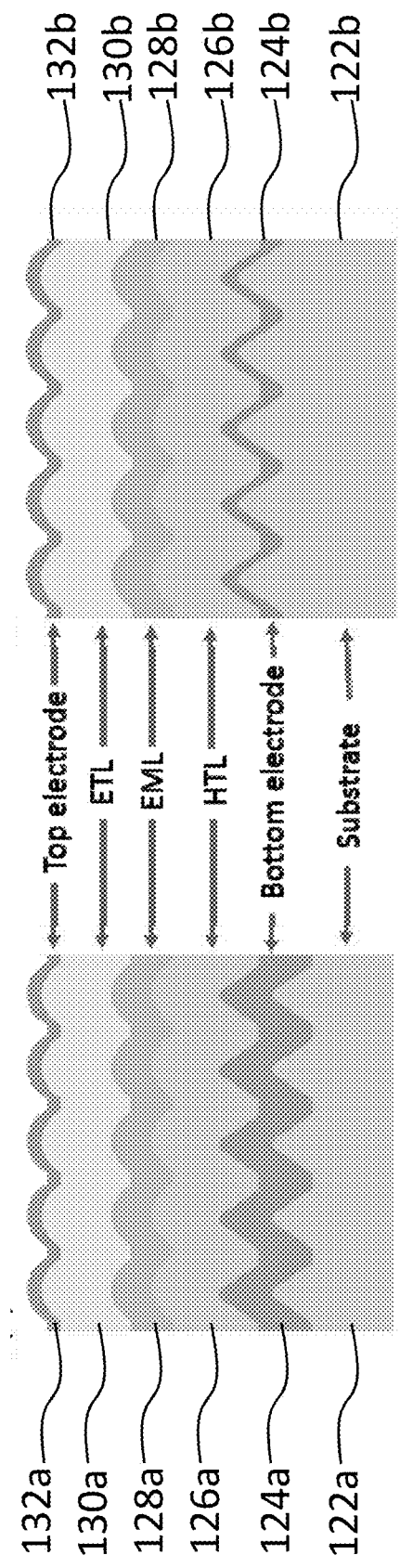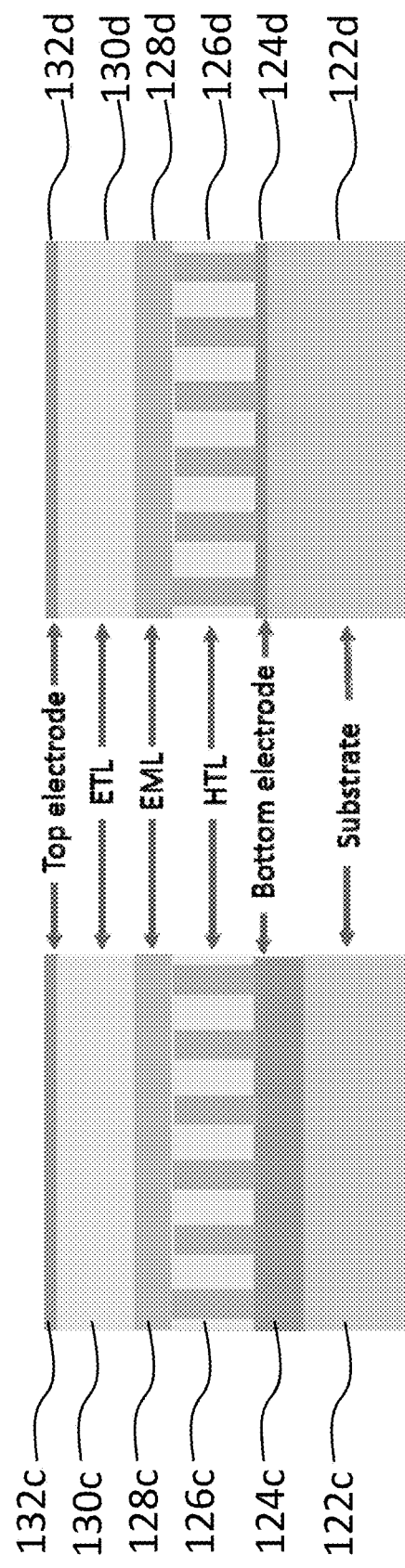
Figure 3A  Figure 3B  Figure 3C  Figure 3D

STRUCTURE FOR EMITTING LIGHT, LIGHT-EMITTING DIODE (LED), AND METHOD OF MANUFACTURING A STRUCTURE FOR EMITTING LIGHT

FIELD

The subject disclosure generally relates to light-emitting diodes (LEDs), and in particular to a structure for emitting light, light-emitting diode (LED), and method of manufacturing a structure for emitting light.

BACKGROUND

In LEDs electrons and electrons holes recombine through the flow of current to release energy in the form of photons, light. Various LEDs exist in the market such as thin-film LEDs which include organic LEDs (OLEDs), quantum dot LEDs (QLEDS), and perovskite LEDs (PeLEDs). The small size, light weight, flexibility, and low cost of thin-film LEDs make them useful light sources in photonic systems such as optical data storage, 3D imaging, wireless communication, and display, e.g. liquid crystal displays (LCDs).

Such systems often require polarized light. Adding a polarizer or polarizing filter to thin-film LEDs provides the required output polarized light. Chemical engineering solutions also exist to produce polarized light. For example, the electric dipole moment of emitters of an LED may be aligned uniaxially through various methods, such as mechanical rubbing, stretching, or polarized ultra-violet (UV) radiation, to produce polarized light. Further metal grating may be added external to a glass substrate of the LED to polarize the emitted light.

While methods of polarizing LED emitted light are known, improvements and/or alternatives are desired.

This background serves only to set a scene to allow a person skilled in the art to better appreciate the following description. Therefore, none of the above discussion should necessarily be taken as an acknowledgement that that discussion is part of the state of the art or is common general knowledge. One or more aspects/embodiments of the disclosure may or may not address one or more of the background issues.

SUMMARY

An aspect of the disclosure relates to a structure for emitting light.

The structure may be configured to emit polarized light without the need with for a polarizer, or chemical engineering solutions. Using a polarizer leads to significant light loss, and generally an increase in the form factor of the structure. As no polarizer is present in the structure such light loss and increased size issues are avoided. Similarly chemical engineering solely result in significant light loses. While a metal grating may be added to an LED to provide polarized light, the addition of metal grating to a glass substrate of an LED structure results in over 70% of light being absorbed by the metal rating. The disclosed structure may avoid such significant light losses.

The structure may form part of an LED. In particular the structure may form part of a thin film LED such as an organic LED (OLED), quantum dot LED (QLED), and perovskite LED (PeLED).

The structure may comprise an emissive layer (EML) positioned between electrodes. The EML may emit light and may therefore be referred to as an emitter.

The EML may be tuned such that emission of a transverse electric (TE) waveguide mode from the EML is at least partially promoted. Generally energy propagates from the EML in a number of different propagation modes. Energy propagating within the structure, which acts as a waveguide, is referred to propagating in waveguide modes. Waveguides modes include the TE waveguide mode, and a transverse magnetic (TM) waveguide mode. Energy propagating out of the structure (waveguide) is referred to propagating in an air mode. Energy propagating or formed on the electrodes may include surface energy propagating in a plasmon polariton (SPP) mode.

Promoting the TE waveguide mode may also promote the TM waveguide mode.

References to the various modes should be understood to refer to propagating energy (light, electromagnetic waves, etc.).

The TE waveguide mode may be dependent upon transverse electric waves, also known as H waves. The electric vector (E) of this mode is perpendicular to the direction of propagation.

In the TM waveguide mode, the magnetic vector (H) is perpendicular to the direction of propagation. The TM waveguide mode are also known as E waves.

The TE waveguide mode has been found to be polarized. Polarized is understood to mean the propagating waves oscillate in an aligned vibration angle.

Promoting emission of the TE waveguide mode from the EML may increase the ratio of polarized light emitted by the structure. This provides a source of polarized light originating at the structure. There is no need for the addition of a polarizer, or the described chemical engineering solutions. This may reduce light lost through these means and accordingly increase the efficiency of the structure in emitting polarized light.

The EML may be tuned such that emission of the TM waveguide mode is at least partially promoted. The TM waveguide mode has been found to be polarized; however, not as significant a portion of this mode is polarized as the TE waveguide mode. Further, the EML may be tuned such that emission of the SPP mode is at least partially promoted. The SPP mode has been found to be polarized; however, not as significant a portion of this mode is polarized as the TE waveguide mode. Accordingly, promoting only the TE waveguide mode may provide a more efficient structure for emitting polarized light.

The structure may further comprise an optical component for diffracting the TE waveguide mode to emit light from the structure. As the TE waveguide mode is polarized light, the diffracted light emitted from the structure is polarized light.

As previously described the waveguide modes emitted by the EML may include the TE waveguide mode, and the TM waveguide mode. These modes are generally trapped within the structure, and not emitted. In contrast the air mode is generally emitted by the structure. The SPP mode may be present on the surfaces of the electrodes. In conventional structures for emitting light, air mode is emitted by the EML and the waveguide modes (TE and TM waveguide modes) are ignored as they are trapped within the structure. However, appreciating that the TE waveguide mode is polarized, an optical component to diffract the TE waveguide mode allows for the TE waveguide mode to be emitted by the EML. The structure therefore emits polarized light without the need for a polarizer, or chemical engineering solutions. This may reduce the costs and size of the structure, and improve the efficiency of light emission.

Promoting the TE waveguide mode therefore may provide a structure with a high polarization ratio. For example, the polarization ratio may be greater than 30. The polarization ratio is understood as the ratio between S-polarized and P-polarized light.

Parameters of the structures may be selected such that emission of the TE waveguide mode is promoted. These parameters may include a position of the EML between the electrodes, a thickness of the EML, EML dipole orientation, and microcavity length, quantum efficiency of the EML, refractive index of the EML, and refractive index of other layers within the structure.

At least one of a position of the EML between the electrodes, a thickness of the EML, EML dipole orientation, and microcavity length may be selected such that emission of the TE waveguide mode is promoted.

A microcavity length may be selected such that emission of the TE waveguide mode is promoted. Microcavity length may be defined as the distance between the electrodes. The microcavity length may be selected to be between 100 nm to several hundred nm.

The microcavity length may be determined through simulation.

At least one of the position of the EML, the thickness of the EML, the EML dipole orientation, and microcavity length may be determined based on a profile of one or more modes emitted by the EML. The modes may include the TE waveguide mode.

The profile may indicate a distribution of the modes, including the TE waveguide mode. The position of the EML within the structure, and thickness of the EML may be selected to align the EML with the profile of the TE waveguide mode. For example, the midpoint of the profile of the TE waveguide mode may be aligned with the midpoint of the EML within the structure. This may serve to promote the TE waveguide mode, and accordingly increase the polarization ratio.

The EML may be tuned such that emission of modes other than the TE waveguide mode are at least partially suppressed. Suppressing the other modes may improve the efficiency of the structure at emitting polarized light, as non-polarized light present in the other modes is suppressed.

The other modes may comprise at least one of air mode, TM waveguide mode, and SPP mode. The profiles of these modes may be determined and the EML may be tuned to suppress these modes. For example, the profile of the SPP mode may indicate peaks near the surfaces of the electrodes. Thus, distancing the EML from the electrodes may suppress these modes. The EML may be distanced from the electrodes by including additional layers within the structure between the EML and the electrodes.

The EML may be tuned such that emission of the air mode is suppressed through destructive interference of modes within the structure.

The EML may be tuned such that emission of the SPP mode is suppressed by increasing the distance between the electrodes and the EML.

These additional layers may comprise a hole transport layer (HTL), electron transport layer (ETL), hole injection layer (HIL), electron blocking layer (EBL), and electron injection layer (EIL).

The optical component may comprise a diffraction grating. The diffraction grating is not intended to polarize the TE waveguide mode, but rather diffract the TE waveguide mode to emit light from the structure. As such the diffraction grating may not substantially absorb the TE waveguide mode. The diffraction grating extracts the TE waveguide mode from the structure to emit light, specifically polarized light.

The diffraction grating may comprise a 1D diffraction grating.

The structure may further comprise a substrate upon which the electrodes are positioned with the EML between the electrodes. The substrate may be transparent, semi-transparent, or opaque.

The substrate may form the diffraction grating. The substrate may comprise a corrugated substrate having a periodic relief surface. The surface relief may have a depth of 20 to 200 nm. The surface relief may be manufactured by E-beam lithography, photolithography, or nanoimprint lithography.

The period of the corrugated substrate having a periodic relief surface may be based on an emission wavelength of the EML. For example, depending on the emission colour from the EML, the period could be varied from 200 nm to 1000 nm.

The 1D grating may be formed at the bottom, top, or middle of the structure. Bottom, top and middle may be with respect to a structure where the electrodes define the top and bottom, and the EML defines a layer between the electrodes. The middle of the structure may be in the EML.

A 1D grating formed at the bottom of the structure may take the form of the substrate as described. A 1D grating formed at the top of the structure.

The 1D grating may have a thickness of more than 50 nm. Having a thickness of greater than 50 nm may address refractive index contrast at an interface between the 1D grating and an adjacent layer.

If the EML is tuned to promote the TE waveguide mode, or the SPP mode as described, the 1D grating may be formed at a determined high intensity position of the respective mode. For example, the SPP mode may have a high intensity at an electrode surface. Accordingly, the 1D grating may be formed proximate the electrode.

The structure may further comprise a HTL positioned between the EML and one of the electrodes. The diffraction grating may comprise a periodic variation in an index of the HTL. The HTL may comprise a hole-conducting photoalignment-liquid-crystal. The periodic index may be formed with interference UV-lithography.

Another aspect of the disclosure relates to a LED. The LED may be a thin-film LED. The LED may be a top-emitting, or semi-transparent thin-film LED. The LED may be an OLED, QLED, or PeLED.

The LED may comprise an EML positioned between electrodes. The EML is tuned such that emission of a TE waveguide mode from the EML is promoted.

Promoting emission of the TE waveguide mode from the EML may increase the ratio of polarized light emitted by the LED. This provides a source of polarized light originating at the LED. There is no need for the addition of a polarizer, or the described chemical engineering solutions. This may reduce light lost through these means and accordingly increase the efficiency of the LED in emitting polarized light.

The LED may further comprise an optical component for diffracting the TE waveguide mode to emit light from the LED. As the TE waveguide mode is polarized light, the diffracted light emitted from the LED is polarized light.

Appreciating that the TE waveguide mode is polarized, including an optical component to diffract the TE waveguide mode allows for the TE waveguide mode to be emitted by the EML. The LED therefore emits polarized light without the need for a polarizer, or chemical engineering solutions.

This may reduce the costs and size of the LED, and improve the efficiency of light emission.

Promoting the TE waveguide mode therefore may provide a LED with a high polarization ratio. For example, the polarization ratio may be greater than 30. The polarization ratio is understood as the ratio between polarized and unpolarised light.

At least one of a position of the EML between the electrodes, a thickness of the EML, EML dipole orientation, and microcavity length may be selected such that emission of the TE waveguide mode is promoted.

A microcavity length may be selected such that emission of the TE waveguide mode is promoted. Microcavity length may be defined as the distance between the electrodes.

At least one of the position of the EML, the thickness of the EML, the EML dipole orientation, and microcavity length may be determined based on a profile of one or more modes emitted by the EML. The modes may include the TE waveguide mode.

The profile may indicate a distribution of the modes, including the TE waveguide mode. The position of the EML within the LED, and thickness of the EML may be selected to align the EML with the profile of the TE waveguide mode. For example, the midpoint of the profile of the TE waveguide mode may be aligned with the midpoint of the EML within the LED. This may serve to promote the TE waveguide mode, and accordingly increase the polarization ratio.

The EML may be tuned such that emission of modes other than the TE waveguide mode are at least partially suppressed. Suppressing the other modes may improve the efficiency of the LED at emitting polarized light, as non-polarized light present in the other modes is suppressed.

The other modes may comprise at least one of air mode, TM waveguide mode, and SPP mode. The profiles of these modes may be determined and the EML may be tuned to suppress these modes. For example, the profile of the SPP mode may indicate peaks near the surfaces of the electrodes. Thus, distancing the EML from the electrodes may suppress these modes. The EML may be distanced from the electrodes by including additional layers within the LED between the EML and the electrodes.

These additional layers may comprise a hole transport layer (HTL), electron transport layer (ETL), hole injection layer (HIL), electron blocking layer (EBL), and electron injection layer (EIL).

The optical component may comprise a diffraction grating. The diffraction grating is not intended to polarize the TE waveguide mode, but rather diffract the TE waveguide mode to emit light from the LED. As such the diffraction grating may not substantially absorb the TE waveguide mode. The diffraction grating extracts the TE waveguide mode from the LED to emit light, specifically polarized light.

The diffraction grating may comprise a 1D diffraction grating.

The LED may further comprise a substrate upon which the electrodes are positioned with the EML between the electrodes. The substrate may be transparent, semi-transparent, or opaque.

The substrate may form the diffraction grating. The substrate may comprise a corrugated substrate having a periodic relief surface. The surface relief may have a depth of 20 to 200 nm. The surface relief may be manufactured by E-beam lithography, photolithography, or nanoimprint lithography.

The LED may further comprise a HTL positioned between the EML and one of the electrodes. The diffraction grating may comprise a periodic variation in an index of the HTL. The HTL may comprise a hole-conducting photoalignment-liquid-crystal. The periodic index may be formed with interference UV-lithography.

Another aspect of the disclosure relates to a method of manufacturing a structure for emitting light.

The method may provide a structure for an LED with improved polarization efficiency over conventional methods. The method may provide a structure for an LED with reduced form factor over conventional structure, and reduce energy/light loses.

The structure may form part of an LED. The LED may be a thin-film LED. The LED may be a top-emitting, or semi-transparent thin-film LED. The LED may be an OLED, QLED, or PeLED.

The method may comprise tuning an emissive layer (EML) positioned between electrodes such that emission of a transverse electric (TE) waveguide mode from the EML is at least partially promoted.

Promoting emission of the TE waveguide mode from the EML may increase the ratio of polarized light emitted by the structure. This provides a source of polarized light originating at the structure. There is no need for the addition of a polarizer, or the described chemical engineering solutions. This may reduce light lost through these means and accordingly increase the efficiency of the structure in emitting polarized light.

The structure may comprise an optical component for diffracting the TE waveguide mode to emit light from the structure.

Appreciating that the TE waveguide mode is polarized, an optical component to diffract the TE waveguide mode allows for the TE waveguide mode to be emitted by the EML. The structure therefore emits polarized light without the need for a polarizer, or chemical engineering solutions. This may reduce the costs and size of the structure, and improve the efficiency of light emission.

The method may comprise depositing the EML on an electrode. The method may further comprise depositing the other electrode on the EML.

The method may comprise depositing an electrode on a substrate, depositing the EML on the electrode, and depositing the other electrode on the EML.

The method may comprise depositing an electrode on a substrate, depositing an HTL on the electrode, depositing the EML on the HTL, depositing an electron transport layer (ETL) on the EML, and depositing the other electrode on the EML.

The structure may have a high polarization ratio. For example, the polarization ratio may be greater than 30.

Tuning the EML may comprise determining at least one of a position of the EML between the electrodes, a thickness of the EML, EML dipole orientation, and microcavity length such that the TE waveguide mode is promoted.

At least one of the position of the EML, the thickness of the EML, the EML dipole orientation, and microcavity length may be determined based on a profile of one or more modes emitted by the EML. The modes may include TE waveguide mode.

The profile may indicate a distribution of the modes, including the TE waveguide mode. The position of the EML within the structure, and thickness of the EML may be selected to align the EML with the profile of the TE waveguide mode. For example, the midpoint of the profile of the TE waveguide mode may be aligned with the midpoint of the EML within the structure. This may serve to promote the TE waveguide mode, and accordingly increase the polarization ratio.

Tuning may comprise determining an output of the structure, and then determining at least one of a position of the EML between the electrodes, a thickness of the EML, EML dipole orientation, and microcavity length such that the TE waveguide mode is promoted based on the determined output. The output of the structure may include light emitted by the EML. Determining the output may comprise measuring an output of the structure. The actual output may be determined, and the noted parameters may be adjusted based on the output to achieve the desired promotion of the TE waveguide mode. Determining the output may instead be based on simulation such that the structure need not build in order to determine the noted parameters to promote the TE waveguide mode.

Tuning the EML may comprise tuning the EML such that modes other than the TE waveguide mode are at least partially suppressed. Suppressing the other modes may improve the efficiency of the structure at emitting polarized light, as non-polarized light present in the other modes is suppressed.

The modes other than the TE comprise at least one of air mode, TM waveguide mode, and SPP mode. The profiles of these modes may be determined and the EML may be tuned to suppress these modes. For example, the profile of the SPP mode may indicate peaks near the surfaces of the electrodes. Thus, distancing the EML from the electrodes may suppress these modes. The EML may be distanced from the electrodes by including additional layers within the structure between the EML and the electrodes.

These additional layers may include a HTL, ETL, HIL, EBL and EIL.

The optical component may comprise a diffraction grating. The diffraction grating is not intended to polarize the TE waveguide mode, but rather diffract the TE waveguide mode to emit light from the structure. As such the diffraction grating may not substantially absorb the TE waveguide mode. The diffraction grating extracts the TE waveguide mode from the structure to emit light, specifically polarized light.

The diffraction grating may comprise a 1D diffraction grating.

The 1D diffraction grating may comprise corrugated substrate upon which one of the electrodes is positioned. The corrugated substrate may comprise a periodic relief surface. The surface relief may have a depth of 20 to 200 nm. The surface relief may be manufactured by E-beam lithography, photolithography, or nanoimprint lithography.

The method may further comprise forming the corrugated substrate of the structure.

The 1D diffraction grating may comprise a periodic variation in an index of a layer positioned between the electrodes. The 1D diffraction grating may comprise a periodic variation is a HTL positioned between the EML and one of the electrodes. The periodic variation may be formed by interference UV-lithography. The HTL may comprise hole-conducting photoalignment-liquid-crystal.

The method further comprise forming a periodic variation in the HTL of the structure. The periodic variation may diffract the TE waveguide mode.

The method may comprise incorporating an optical component into the structure. Incorporating the optical component may comprise incorporating a 1D grating into the structure. Incorporating the 1D grating may comprise using a corrugated substrate. Incorporating the 1D grating may comprise incorporating an index nanopattern in the HTL. The index nanopattern may be incorporated by using a hole-conducting photoalignment-liquid-crystal as the HTL in combination with interference UV-lithography. During this process, molecules in the regions under UV illumination undergo reorientation to align uniaxially along the polarization direction of the UV light, leading to an increase in the refractive index, while regions without UV illumination still maintain a random molecular orientation and a lower refractive index. Thus, the index nanopattern on the HTL may be created.

The structure may include an organic material such as polyphenylene vinylene (PPV), Tris(8-hydroxyquinolinato) aluminium, polymethyl methacrylate (PMMA), organometallic chelates, e.g. $Alq_3$, and combinations thereof. The EML may comprise bis [2-(2-pyridinyl-N)phenyl-C](acetylacetonato)iridium(III) (Ir(ppy)2(acac)).

The EML may have a peak wavelength of 520 nm. The EML may have a thickness of 80 nm. The HTL may have a thickness of 115 nm.

The structure may include a substrate. The substrate may have a depth of 70 nm.

The substrate may be corrugated with a periodic relief surface. The surface may have a depth of 70 nm and a period of 350 nm.

The two electrodes may comprise a top electrode and a bottom electrode with the EML positioned between the top and bottom electrodes. A current between the electrodes may result in the combining of electrons and electron holes in the EML resulting in the emission of light.

The structure may comprise a multi-layered stack. The structure may be formed by layering or depositing elements or layers on a substrate. One electrode, a bottom electrode, may be deposited on the substrate. The EML may then be deposited on the bottom electrode. The other electrode, a top electrode, may then be deposited on the EML.

Additional layers may be present in the structure. For example, a HTL may be present between a bottom electrode and the EML, and a ETL may be present between the EML and a top electrode.

One electrode, a bottom electrode, may have a thickness of approximately 100 nm. The bottom electrode may have a thickness of approximately 5-20 nm to maintain transparency of the structure.

One electrode, a bottom electrode, may comprise a metal film. The metal film may be a single composition such as aluminium or silver; an alloy such as MgAl; or a multi-layered stack such as CaAl and MgAg.

One electrode, a top electrode, may have a thickness of 5-20 nm. This may maintain transparency of the structure.

One electrode, a top electrode, may comprise a metal film.

The described structure and/or LED may couple over 80% of light emitted from the EML into the TE waveguide mode.

Tuning the structure to promote the TE waveguide mode may comprise coupling light emitted from the EML into the TE waveguide mode. Coupling may comprise coupling over 80% of light emitted from the EML into the TE waveguide mode.

The described structure and/or LED may have a high current efficiency of over 130 cd/A, an external quantum efficiency (EQE) over 14%, and a polarization ratio of over 30 in the wavelength range of 530 to 570 nm.

Another aspect of the disclosure relates to a computer readable medium having computer program code stored thereon, the computer program code when executed by a processor performing any of the described methods. The computer readable medium may be non-transitory.

The computer readable medium may form part of a computing device. The computing device may be a personal computer or other suitable processing device comprising, for example, a processing unit, system memory (volatile and/or non-volatile memory), other non-removable or removable memory (e.g., a hard disk drive, RAM, ROM, EEPROM, CD-ROM, DVD, flash memory, etc.) and a system bus coupling the various computing device components to the processing unit. The computing device may also comprise networking capability using Ethernet, WiFi, and/or other network format, for connection to access shared or remote drives, one or more networked computers, or other networked devices.

The method may be performed in part by a device or apparatus. The device may be located at surface location. The device may be located uphole of the despooled spool. The device may comprise a processor and memory. The processor may be configured to perform the described method. The device may comprise computer-readable medium may comprise any suitable memory or storage device such as random-access memory (RAM), static RAM (SRAM), dynamic RAM (DRAM), non-volatile RAM (NVRAM), read-only memory (ROM), or Flash memory.

The processor may have a single-core processor or multiple core processors composed of a variety of materials.

While structures, LEDs, methods, and computer readable medium have been described which is tuned to at least partially promote particular emission, e.g. the TE waveguide mode, other emissions may instead be promoted. For example, any of the described elements, e.g. structure, LED, etc., may be tuned to at least partially promote the TM waveguide mode, or the SPP mode. References above to the TE waveguide mode may accordingly be replaced with the TM waveguide mode or the SPP mode.

Features, benefits, or advantages associated with particular examples or embodiments relating to any one described aspect may equally relate to any other one or more described aspects.

Further elements of the aspects described may include one or more examples, embodiments or features in isolation or in various combinations whether or not specifically stated (including claimed) in that combination or in isolation.

BRIEF DESCRIPTION OF THE DRAWINGS

These and other aspects of the present disclosure will now be described, by way of example only, with reference to the accompanying Figures, in which:

FIGS. 3a-d are diagrams of structures for an LED in accordance with aspects of the disclosure;

DETAILED DESCRIPTION

Figure 1:
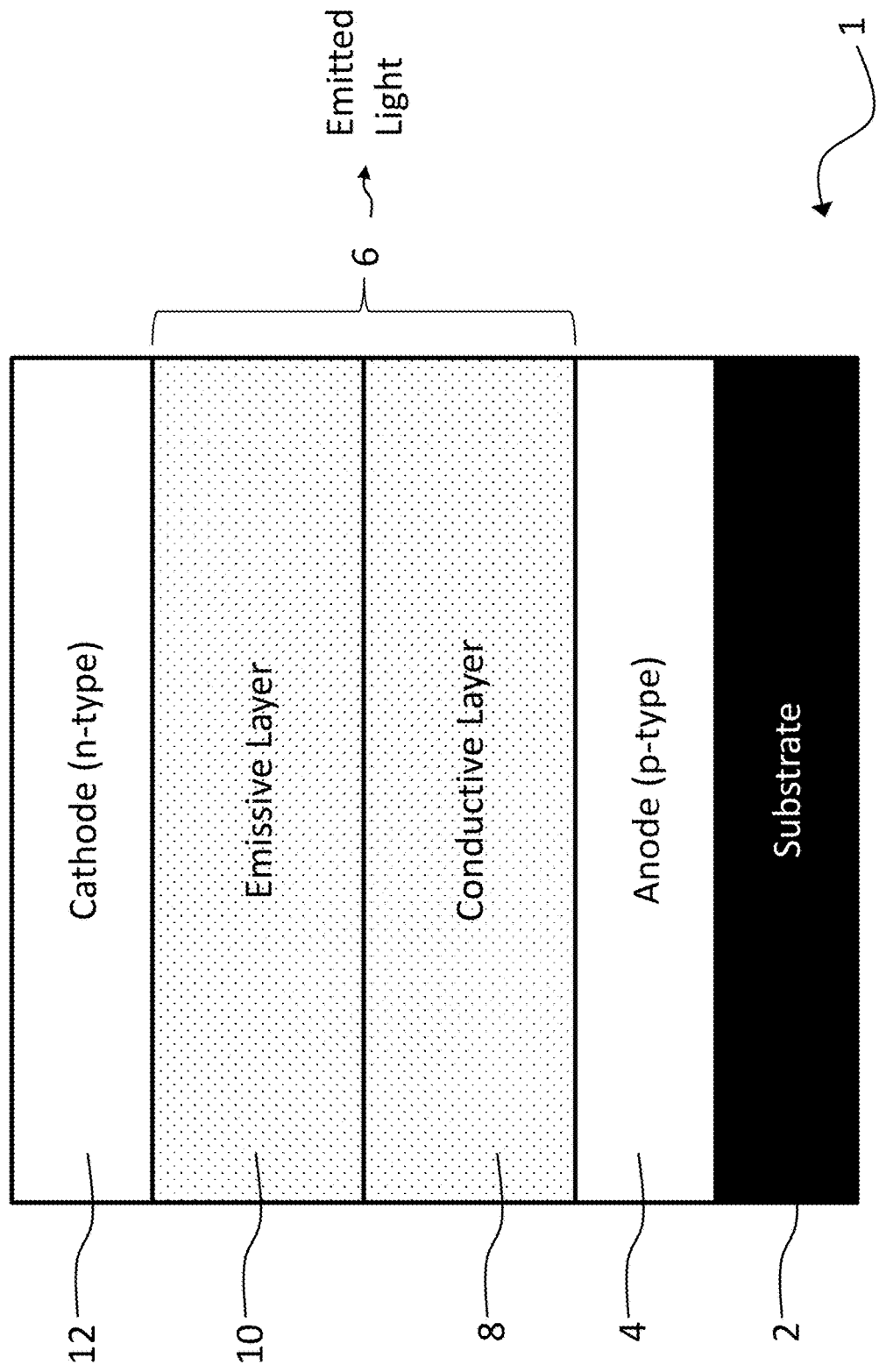
FIG. 1 is a diagram of an light-emitting diode (LED)

The foregoing summary, as well as the following detailed description of certain embodiments will be better understood when read in conjunction with the accompanying drawings. As will be appreciated, like reference characters are used to refer to like elements throughout the description and drawings. As used herein, an element or feature recited in the singular and preceded by the word "a" or "an" should be understood as not necessarily excluding a plural of the elements or features. Further, references to "one example" or "one embodiment" are not intended to be interpreted as excluding the existence of additional examples or embodiments that also incorporate the recited elements or features of that one example or one embodiment. Moreover, unless explicitly stated to the contrary, examples or embodiments "comprising", "having" or "including" an element or feature or a plurality of elements or features having a particular property might further include additional elements or features not having that particular property. Also, it will be appreciated that the terms "comprises", "has" and "includes" mean "including but not limited to" and the terms "comprising", "having" and "including" have equivalent meanings.

As used herein, the term "and/or" can include any and all combinations of one or more of the associated listed elements or features.

It will be understood that when an element or feature is referred to as being "on", "attached" to, "connected" to, "coupled" with, "contacting", etc. another element or feature, that element or feature can be directly on, attached to, connected to, coupled with or contacting the other element or feature or intervening elements may also be present. In contrast, when an element or feature is referred to as being, for example, "directly on", "directly attached" to, "directly connected" to, "directly coupled" with or "directly contacting" another element of feature, there are no intervening elements or features present.

It will be understood that spatially relative terms, such as "under", "below", "lower", "over", "above", "upper", "front", "back" and the like, may be used herein for ease of describing the relationship of an element or feature to another element or feature as depicted in the figures. The spatially relative terms can however, encompass different orientations in use or operation in addition to the orientation depicted in the figures.

Reference herein to "example" means that one or more feature, structure, element, component, characteristic and/or operational step described in connection with the example is included in at least one embodiment and or implementation of the subject matter according to the present disclosure. Thus, the phrases "an example," "another example," and similar language throughout the present disclosure may, but do not necessarily, refer to the same example. Further, the subject matter characterizing any one example may, but does not necessarily, include the subject matter characterizing any other example.

Reference herein to "configured" denotes an actual state of configuration that fundamentally ties the element or feature to the physical characteristics of the element or feature preceding the phrase "configured to".

Unless otherwise indicated, the terms "first," "second," etc. are used herein merely as labels, and are not intended to impose ordinal, positional, or hierarchical requirements on the items to which these terms refer. Moreover, reference to a "second" item does not require or preclude the existence of lower-numbered item (e.g., a "first" item) and/or a higher-numbered item (e.g., a "third" item).

As used herein, the terms "approximately" and "about" represent an amount close to the stated amount that still performs the desired function or achieves the desired result. For example, the terms "approximately" and "about" may refer to an amount that is within less than 10% of, within less than 5% of, within less than 1% of, within less than 0.1% of, or within less than 0.01% of the stated amount.

Turning now to FIG. 1 a diagram of a typical LED 1 is shown. As shown in FIG. 1, the LED 1 comprises a stack of elements. The LED 1 comprises a substrate 2 which forms a lowermost base of the LED 1. The substrate 2 may be comprised of plastic, glass, or foil. The substrate 2 may be clear. The substrate 2 supports the further layers of the LED 1. Positioned above or adjacent the substrate 2 is a lower or bottom electrode which forms an anode 4. The anode 4 forms a positive terminal in use. Positioned above the anode 4 is a layer 6. Positioned adjacent or above the layer 6 is a cathode 12 which forms a negative terminal. Electron holes (+) from the anode 4 combine with electrons (−) from the cathode 12 in the layer 6 and release photonic energy, light.

In the case of an organic LED (OLED), the layer 6 comprises organic material. The organic material is comprised of organic molecules or polymers. For example, the organic layer may comprise polyphenylene vinylene (PPV), Tris(8-hydroxyquinolinato)aluminium, polymethyl methacrylate (PMMA), organometallic chelates, e.g. Alq$_3$, and combinations thereof.

The layer 6 may be formed from multiple layers of elements. For example, the layer 6 may comprise a conductive layer 8 and an emissive layer 10. Electron holes (+) are transported from the anode 4 into the conductive layer 8. Electrons (−) are transported from the cathode 12 into the emissive layer 10. At the boundary between the conductive layer 8 and emissive layer 10, electrons (−) and holes (+) combine to release or emit light.

In the case of an OLED, the conductive layer 8 comprises organic molecules, e.g. organic plastic molecules. The conductive layer 8 may comprise, for example, polyaniline. The emissive layer 10 comprises organic molecules, e.g. organic plastic molecules which are different than the molecules of the conductive layer 8. The emissive layer 10 may comprise, for example, polyfluorene.

An additional layer (not shown) may be present on top of the cathode. This layer may seal and/or protect the underlying layers. This layer may be formed of glass, plastic, or other materials.

While the LED 1 has been described as having a particular physical orientation with layers above lower layers, one of skill in the art will appreciate this orientation may be varied so as all respective layer positioning is maintained. For example, the cathode 12 may be the lowermost layer, and the substrate 2 the uppermost layer. Further the cathode 12 may be rightmost layer, and the substrate 2 the leftmost layer.

Further while a bilayer structure of layer 6 has been described one of skill in the art will appreciate other configurations are possible. For example, the layer 6 may comprise, starting at the lowermost layer and moving to the uppermost layer, a hole injection layer (HIL), hole transport layer (HTL), electron blocking layer (EBL), emissive layer (EML), electron transport layer (ETL), and electron injection layer (EIL). The HIL may be adjacent the anode 4. The EIL may be adjacent the cathode 12.

Figure 2:
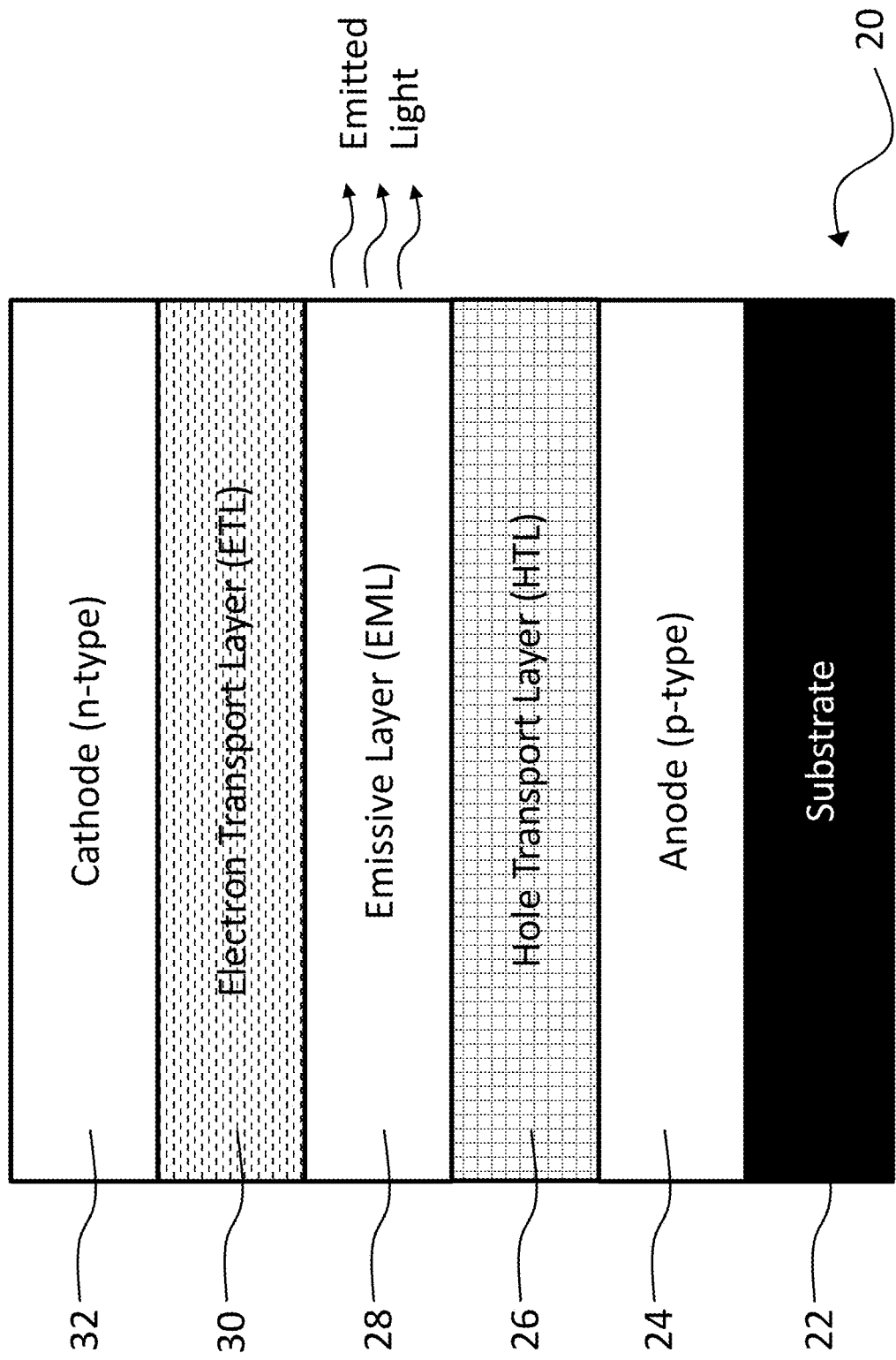
FIG. 2 is another diagram of an LED.

Turning now to FIG. 2 a diagram of a specific stack of layers of an LED 20 is shown. As with LED 1, the LED 20 comprises a substrate 22 which forms a lowermost base of the LED 20. The substrate 22 supports the further layers of the LED 20. Positioned on or adjacent the substrate 22 is a lower or bottom electrode which forms an anode 24. In use the anode 24 forms a positive terminal. Positioned on or adjacent the anode 24 is a HTL 26. Positioned on or adjacent the HTL 26 is a EML 28. Positioned on or adjacent the EML 28 is a ETL 30. The ETL 30 facilitates electron injection and transport from the cathode 32 to the EML 28. Positioned on or adjacent the ETL 30 is top or upper electrode which forms a cathode 32. In use the cathode 32 forms a negative terminal.

The various layers may be deposited on one another. The anode 24 is deposited on the substrate 22, the HTL 28 is deposited on the anode 24, the EML 28 is deposited on the HTL 26, the ETL 30 is deposited on the EML 28, and the cathode 32 is deposited on the ETL 30.

When a voltage is applied between the anode 24 and cathode 32 in a particular direction, a current between the anode 24 and cathode 32 drives movement of electron holes (+) and electrons (−). The EML 28 accepts electron holes (+) from the anode 24 via the HTL 26, and electrons (−) from the cathode 32 via the ETL 30. The electron holes (+) and electrons (−) combine in the EML 28 to generate electroluminescence (EL), i.e. emit light.

While a certain structure of the LED 20 has been described, other layers may be present. For example, an HIL and EBL may also be present adjacent the HTL 26. Further, an EIL and HBL may be present on the ETL 30. These additional layers may assist in achieving an optimized charge balance.

While the LED 20 has been described as having a particular physical orientation with layers above lower layers, one of skill in the art will appreciate this orientation may be varied so as all respective layer positioning is maintained. For example, the cathode 32 may be the lowermost layer, and the substrate 22 the uppermost layer. Further the cathode 32 may be rightmost layer, and the substrate 22 the leftmost layer.

Further, as one of skill in the art will appreciate, the position of the HTL 26 and ETL 30 may be switched to improve LED efficiency and extend the lifetime of the LED 20.

Particular applications in which LEDs, in particular thinfilm LEDs, may be well suited, such as in photonic systems, often require polarized light. Conventional methods of producing polarized light involve the addition of a polarizer or polarizing filter. However, the addition of such a polarizer increases the form factor of the LED thereby making the LED not suitable for certain applications.

Alternate conventional methods of producing polarized light include chemical engineering solutions such as uniaxially aligning the electric dipole moment of the emitter of the LED. Such aligned emitters may provide linearly polarized emission. However, these LEDs generally exhibit poor performance with efficiency below 5 cd/A, and polarization ratios below 10. Ratios below 10 are well below the benchmark of 30 generally needed for most applications. Further chemical engineering solutions include the addition of metal grating external to the substrate of the LED. However, over 70% of light may be absorbed by this metal grating leading to significantly reduced efficiency. Furthermore, this approach cannot be applied to top-emitting LEDs prohibiting its use in particular application, e.g. active-matrix self-emissive displays.

The subject disclosure describes a method and structure for emitting light which emits higher levels of polarized light, i.e. higher efficiency light generation, while maintaining the form factor of the structure such that the resulting LED is suitable for a wide range of applications.

Turning now to FIGS. 3A-D diagrams of structures for emitting light are disclosed. The structure may be used to form an LED. Each structure comprises a substrate 122, anode (bottom electrode) 124, HTL 126, EML 128, ETL 130, and cathode (top electrode) 132. The various layers are the same as the layers described in respect of FIG. 2 unless otherwise stated.

The four different structures illustrated shall be referred to as structures 1-4 hereafter with layers being suffixed by a-d depending on their respective structure. For example, structure 1 comprises EML 128a, and structure 3 comprises HTL 126C. Structure 1 is illustrated in FIG. 3A, structure 2 in FIG. 3B, structure 3 in FIG. 3C, and structure 4 in FIG. 3D.

The EML 128 of each structure has been tuned such that emission of a TE waveguide mode from the EML 128 is promoted. Further the layers of each structure, including the EML 128, but not only limited to the EML 128, are tuned such that emission of other modes, e.g. SPP, TM, and other modes, are suppressed. For example, the HTL 126 facilitates electron hole (+) injection and transport into the EML 128. The HTL 126 further functions as a spacer to keep the EML 128 away from the anode 124. Maintaining space between the EML 128 and the anode 124 via the HTL 126 may suppress the SPP mode. Further, maintaining space between the EML 128 and the cathode 132 via the ETL 130 may suppress the SPP mode. Such suppression of the SPP mode promotes other modes such as the TE waveguide mode.

Tuning may include varying the position of the EML 128 between the electrodes (anode 124 and cathode 132), a thickness of the EML 128, EML 128 dipole orientation, and microcavity length (the distance between the anode 124 and cathode 132, top and bottom electroces) to promote the TE waveguide mode, and/or suppress other modes.

Further, the microcavity length, and the EML 128 (emitter) position in the microcavity may further be varied by altering the thickness of other layers, e.g. HTL 126, ETL 130, such that the air mode is suppressed to achieve a high polarization ratio.

As a result of such tuning to promote the TE waveguide mode, a significant majority of light may be coupled into the TE waveguide mode leading to a "single mode" device. The suppression of other modes may further improve this coupling such that over 80% of light is coupled to the TE waveguide mode.

Each structure also includes an optical component for diffracting the promoted TE waveguide mode to emit light from the structure. As will be described the optical component takes the form of a 1D grating either through corrugated substrate, or an index nanopattern in the HTL. As the TE waveguide mode is polarized, the emitted light is polarized. Such an arrangement provides high efficiency while maintaining the form factor required for many applications.

Each structure will now be described in turn.

Structure 1

Turning now to FIG. 3A, structure 1 generally forms a top-emitting LED with a corrugated substrate. Structure 1 comprises substrate 122a. Substrate 122a comprises a 1D periodic surface relief. Substrate 122a is transparent or opaque. The depth of the surface relief is in the range of 20~200 nm, while the period (from hundreds of nm to several μm) is determined by the effective index of the TE waveguide mode and the emission wavelength as will be described. The surface relief may be fabricated by E-beam lithography, photolithography, and nanoimprint lithography.

Structure 1 further comprises anode 124a (bottom electrode). The anode 124a is deposited on the substrate 122a. The anode 124a comprises a thin metal film. The metal film can be a single composition such as Al and Ag, or an alloy such as Mg:Ag, or a multi-layer stack such as Ca/Al and Mg/Ag, depending on the optimization in the work function, transparency, conductivity and absorption. The anode 124a has a thickness of approximately 100 nm to reflect all the light into the EML 128a.

The HTL 126a is deposited on the anode 124a to facilitate electrode hole (+) injection and transport to the EML 128a. As previously described the HTL 126a also functions as a spacer to keep the EML 128a far away from the anode 124a (bottom electrode) to suppress the SPP mode. The refractive index of the HTL 124a is uniform in the lateral direction.

The EML 128a is deposited on the HTL 126a. The EML 128a is made from organic semiconductor, quantum dots, or metal-halide perovskites. This EML 128a accepts the electron holes (+) and electrons (−) from HTL 126a, and ETL 130a, respectively, leading to electron-hole recombination and subsequent electroluminescence (EL).

The EML 128a (emitter) may be tuned to have a higher degree of parallel orientation to further promote the TE waveguide mode, and suppress other modes, e.g. the TM waveguide mode and the SPP mode.

The ETL 130a is deposited on the EML 128a. The ETL 130a facilitates electron injection and transport into the EML 130a. Further the ETL 130a may be tuned separately between the EML 128a and the cathode 132a (top electrode) to suppress the SPP mode.

The cathode 132a (top electrode) is deposited on the ETL 130a. The cathode 132a comprises thin metal film. The metal film is around 5~20 nm in thickness to allow top emission.

Structure 2

Turning now to FIG. 3b, structure 2 generally forms a semi-transparent LED with a corrugated substrate. Structure 2 comprises substrate 122b. Substrate 122b comprises a 1D periodic surface relief. Substrate 122b is transparent. The depth of the surface relief is in the range of 20~200 nm, while the period (from hundreds of nm to several μm) is determined by the effective index of the TE waveguide mode and the emission wavelength as will be described. The surface relief may be fabricated by E-beam lithography, photolithography, and nanoimprint lithography.

Structure 2 further comprises anode 124b (bottom electrode). The anode 124b is deposited on the substrate 122b. The anode 124b comprises a thin metal film. The metal film can be a single composition such as Al and Ag, or an alloy such as Mg:Ag, or a multi-layer stack such as Ca/Al and Mg/Ag, depending on the optimization in the work function, transparency, conductivity and absorption. The anode 124b has a thickness of around 5-20 nm to maintain good transparency with the entire stack of layers of the structure.

The HTL 126b is deposited on the anode 124b to facilitate electrode hole (+) injection and transport to the EML 128b. As previously described the HTL 126b also functions as a spacer to keep the EML 128b far away from the anode 124b (bottom electrode) to suppress the SPP mode. The refractive index of the HTL 124b is uniform in the lateral direction.

The EML 128b is deposited on the HTL 126b. The EML 128b is made from organic semiconductor, quantum dots, or metal-halide perovskites. This EML 128b accepts the electron holes (+) and electrons (−) from HTL 126b, and ETL 130b, respectively, leading to electron-hole recombination and subsequent electroluminescence (EL).

The EML 128b (emitter) may be tuned to have a higher degree of parallel orientation to further promote the TE waveguide mode, and suppress other modes, e.g. the TM waveguide mode and the SPP mode.

The cathode 132b (top electrode) is deposited on the ETL 130b. The cathode 132b comprises thin metal film. The metal film allows for good transparency of the entire device stack of layers of structure 2.

Structure 3

Turning now to FIG. 3c, structure 3 generally forms a top-emitting LED with an index nanopattern on an HTL. In contrast with structures 1 and 2, the substrate 122c of structure 3 is planar. Further the substrate 122c is transparent or opaque.

Structure 3 further comprises anode 124c (bottom electrode). The anode 124c is deposited on the substrate 122c. The anode 124c comprises a thin metal film. The metal film can be a single composition such as Al and Ag, or an alloy such as Mg:Ag, or a multi-layer stack such as Ca/Al and Mg/Ag, depending on the optimization in the work function, transparency, conductivity and absorption. The anode 124c has a thickness of approximately 100 nm to reflect all the light into the EML 128c.

There is a periodic variation in nanoscale in the index of the HTL 126c. Such an index nanopattern may be achieved by using a hole-conducting photoalignment-liquid-crystal as the HTL 126c in combination with interference UV-lithography. This is described in: M. P. Aldred, P. Vlachos, A. E. A. Contoret, S. R. Farrar, W. Chung-Tsoi, B. Mansoor, K. L. Woon, R. Hudson, S. M. Kelly, M. O'Neill, Linearly Polarised Organic Light-Emitting Diodes (OLEDs): Synthesis and Characterisation of a Novel Hole-Transporting Photoalignment Copolymer, J. Mater. Chem. 2005, 15, 3208-3213; T. Höfler, M. Weinberger, W. Kern, S. Rentenberger, A. Pogantsch, Modifying the Output Characteristics of an Organic Light-Emitting Device by Refractive-Index Modulation, Adv. Funct. Mater. 2006, 16, 2369-2373; and D. Qiao, G. Chen, Y. Gong, K. Li, Y. Fan, B. Zhang, F. Jia, Y. Abubakar, A. Jones, I. Otung, N. Copner, Design and Optical Characterization of an Efficient Polarized Organic Light Emitting Diode Based on Refractive Index Modulation in the Emitting Layer, Opt. Express 2020, 28, 40131, the relevant portions of which are incorporated by reference herein.

During this process, molecules in the regions under UV illumination undergo reorientation to align uniaxially along the polarization direction of the UV light, leading to an increase in the refractive index, while regions without UV illumination still maintain a random molecular orientation and a lower refractive index. As thus, the index nanopattern on the HTL 126c can be created.

The EML 128c is deposited on the HTL 126c. The EML 128c is made from organic semiconductor, quantum dots, or metal-halide perovskites. This EML 128c accepts the electron holes (+) and electrons (−) from HTL 126c, and ETL 130c, respectively, leading to electron-hole recombination and subsequent electroluminescence (EL).

The EML 128c (emitter) may be tuned to have a higher degree of parallel orientation to further promote the TE waveguide mode, and suppress other modes, e.g. the TM waveguide mode and the SPP mode.

The cathode 132c (top electrode) is deposited on the ETL 130c. The cathode 132c comprises thin metal film. The metal film is around 5~20 nm in thickness to allow top emission.

Structure 4

Turning now to FIG. 3d, structure 4 generally forms a semi-transparent LED with an index nanopattern on an HTL. In contrast with structures 1 and 2, the substrate 122d of structure 4 is planar. Further the substrate 122d is transparent.

Structure 4 further comprises anode 124d (bottom electrode). The anode 124a is deposited on the substrate 122d. The anode 124d comprises a thin metal film. The metal film can be a single composition such as Al and Ag, or an alloy such as Mg:Ag, or a multi-layer stack such as Ca/Al and Mg/Ag, depending on the optimization in the work function, transparency, conductivity and absorption. The anode 124d has a thickness of around 5-20 nm to maintain good transparency with the entire stack of layers of the structure.

There is a periodic variation in nanoscale in the index of the HTL 126d. Such an index nanopattern may be achieved by using a hole-conducting photoalignment-liquid-crystal as the HTL 126d in combination with interference UV-lithography. This is described in: M. P. Aldred, P. Vlachos, A. E. A. Contoret, S. R. Farrar, W. Chung-Tsoi, B. Mansoor, K. L. Woon, R. Hudson, S. M. Kelly, M. O'Neill, Linearly Polarised Organic Light-Emitting Diodes (OLEDs): Synthesis and Characterisation of a Novel Hole-Transporting Photoalignment Copolymer, J. Mater. Chem. 2005, 15, 3208-3213; T. Höfler, M. Weinberger, W. Kern, S. Rentenberger, A. Pogantsch, Modifying the Output Characteristics of an Organic Light-Emitting Device by Refractive-Index Modulation, Adv. Funct. Mater. 2006, 16, 2369-2373; and D. Qiao, G. Chen, Y. Gong, K. Li, Y. Fan, B. Zhang, F. Jia, Y. Abubakar, A. Jones, I. Otung, N. Copner, Design and Optical Characterization of an Efficient Polarized Organic Light Emitting Diode Based on Refractive Index Modulation in the Emitting Layer, Opt. Express 2020, 28, 40131, the relevant portions of which are incorporated by reference herein.

During this process, molecules in the regions under UV illumination undergo reorientation to align uniaxially along the polarization direction of the UV light, leading to an increase in the refractive index, while regions without UV illumination still maintain a random molecular orientation and a lower refractive index. As thus, the index nanopattern on the HTL 126d can be created.

The EML 128d is deposited on the HTL 126d. The EML 128d is made from organic semiconductor, quantum dots, or metal-halide perovskites. This EML 128d accepts the electron holes (+) and electrons (−) from HTL 126d, and ETL 130d, respectively, leading to electron-hole recombination and subsequent electroluminescence (EL).

The EML 128d (emitter) may be tuned to have a higher degree of parallel orientation to further promote the TE waveguide mode, and suppress other modes, e.g. the TM waveguide mode and the SPP mode.

The cathode 132d (top electrode) is deposited on the ETL 130d. The cathode 132d comprises thin metal film. The metal film allows for good transparency of the entire device stack of layers of structure 4.

While not shown, other layers may be present in all structures. These include an EIL and HBL. Such additional layers may be used to achieve an optimized charge balance.

While the structures have been described in relation as having particular physical orientation with layers above lower layers, one of skill in the art will appreciate this orientation may be varied so as all respective layer positioning is maintained. For example, the cathode 132 may be the lowermost layer, and the substrate 122 the uppermost layer. Further the cathode 132 may be rightmost layer, and the substrate 122 the leftmost layer.

In comparison with structures 1 and 2, structures 3 and 4 generally provide better device stability due to their planar structure.

As one of skill in the art will appreciate, the position of HTL 126 and ETL 130 in the describes structures may be switched to achieve a better device efficiency and lifetime. In this case, the ETL 130 in structures 3 and 4 is subjected to index nanopattern to diffract the TE waveguide mode.

Figure 4:
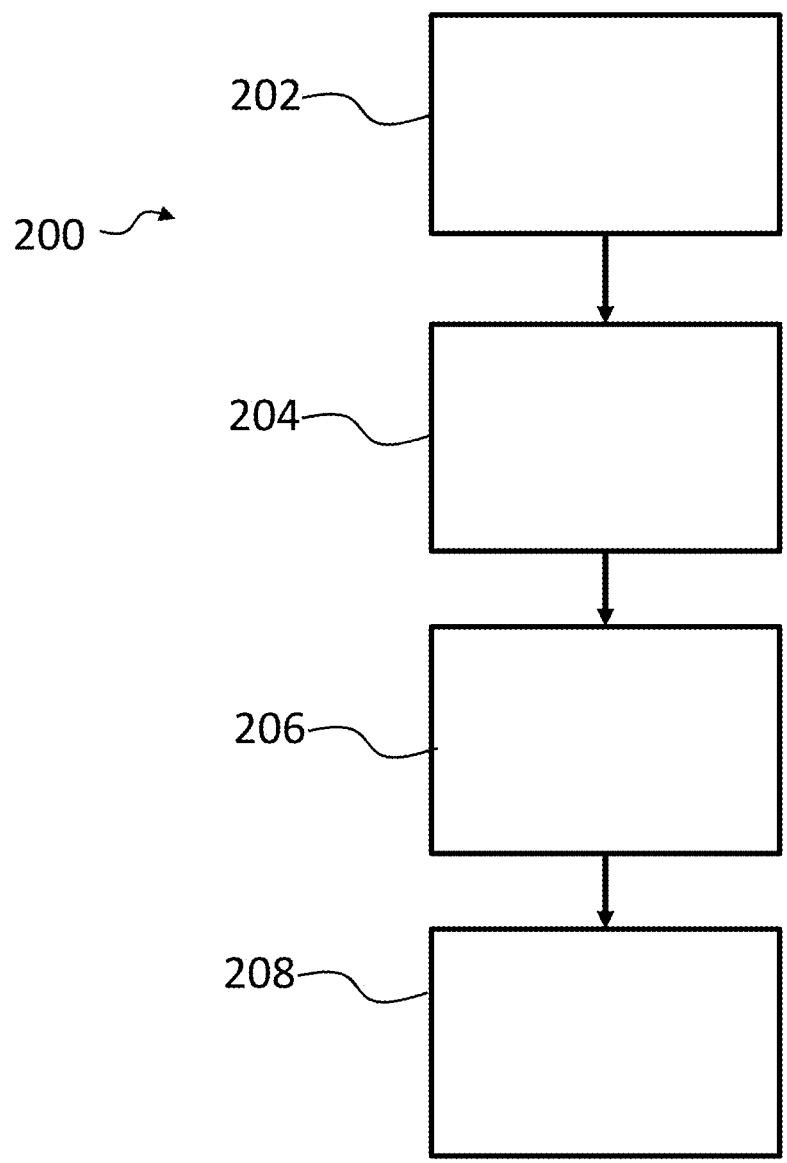
FIG. 4 is a flowchart of a method of manufacturing a structure for emitting light in accordance with an aspect of the disclosure.

Turning now to FIG. 4, a flowchart of a method 200 of manufacturing a structure for emitting light is illustrated. The method 200 comprises tuning an EML positioned between electrodes such that emission of a TE waveguide mode from the EML is promoted. The structure includes an optical component for diffracting the TE waveguide mode to emit light from the structure.

As shown in FIG. 4, tuning comprises analysing 202 a profile of trapped modes in the structure. The modes may include air, TE waveguide, TM waveguide, and SPP modes. The analysing 202 analysing the profiles of trapped modes by finite-difference time-domain (FDTD) simulation. The profile may indicate certain modes are present at certain locations in the structure. For example, the TE waveguide mode may be present in the middle of the structure while other modes are present at the ends of the structure, e.g. proximate the electrodes.

Tuning further comprises determining 204 a position of the EML between the electrodes based on the profile. Determining 204 a position of the EML may also include determining a thickness of the EML within the structure.

Tuning further comprises determining 206 thicknesses of the HTL and ETL based on the profile. The determined HTL and ETL thicknesses may promote the TE waveguide mode while suppressing other modes. The HTL and ETL thicknesses may be tuned simultaneously. The determined HTL and ETL thicknesses may provide a spacer between the EML (emitter) and the electrodes to ensure modes other than the TE waveguide mode are suppressed. Further modes present at the periphery of the structure, i.e. adjacent the electrodes, may be suppressed by determining appropriate HTL and ETL thicknesses.

The method 200 further comprises incorporating 208 an optical component into the structure. The optical component is for diffracting the TE waveguide mode to emit light from the structure. Incorporating the optical component may comprise incorporating a 1D grating into the structure. As described in relation to structures 1 and 2, incorporating the 1D grating may comprise using a corrugated substrate. As described in relation to structures 3 and 4, incorporating the 1D grating may comprise incorporating an index nanopattern in the HTL. The index nanopattern may be incorporated by using a hole-conducting photoalignment-liquid-crystal as the HTL in combination with interference UV-lithography. During this process, molecules in the regions under UV illumination undergo reorientation to align uniaxially along the polarization direction of the UV light, leading to an increase in the refractive index, while regions without UV illumination still maintain a random molecular orientation and a lower refractive index. Thus, the index nanopattern on the HTL may be created.

An experimental LED was constructed according to the disclosure to illustrate the described principles and/or benefits. The experimental LED was constructed according to structure 1. A common organic green emitter, bis [2-(2-pyridinyl-N)phenyl-C](acetylacetonato)iridium(III) (Ir(ppy)2(acac)), was used as the EML 128a. This emitter exhibits a peak wavelength of photoluminescence (PL) at 520 nm. The corrugated substrate 122a was fabricated by nanoimprint lithography with a period of 350 nm and a depth of 70 nm. Both top and bottom electrodes (122a, 132a) were made from silver.

In order the tune structure to promote the TE waveguide, an analysis of the profile of all trapped modes in the structure is conducted by finite-difference time-domain (FDTD) simulation. It is assumed that adding a 1D grating does not lead to a significant change to the profile.

Figure 5:
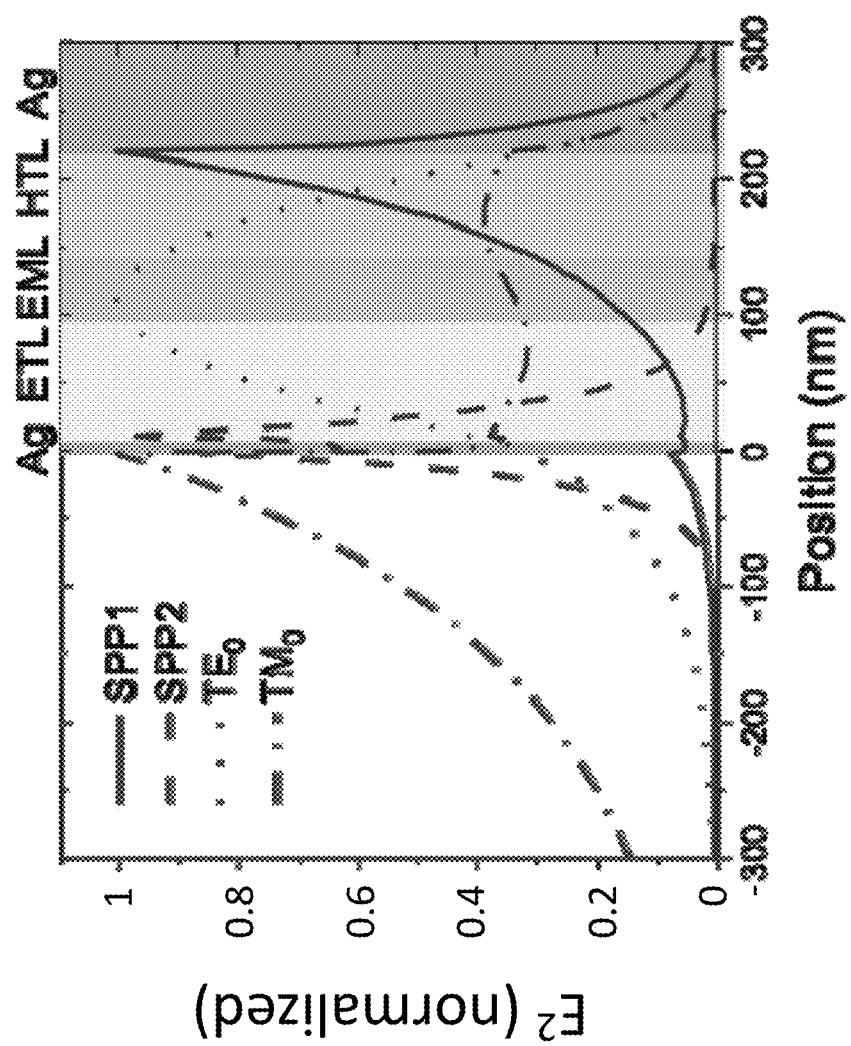
FIG. 5 is a graph of energy relative to distance of modes trapped in a structure for emitting light.

The simulation results are shown in FIG. 5. FIG. 5 is a graph of energy relative to distance of modes trapped in a structure for emitting light. The graph depicts the energy of the different modes trapped in the structure relative to the distance from the base of the substrate, i.e. 0 nm, through to the top of the structure at the top of the cathode (top electrode), i.e. 300 nm. The various layers of the substrate (electrodes, ETL, EML, HTL) are highlighted in various shades in the graph. The electrodes are indicated as Ag at either end of the structure.

As shown in FIG. 5 the two SPP modes (SPP1 and SPP2) distribute near the metal surface (the electrodes), and decay quickly towards the middle of the structure. This is expected as the SPP mode is present on the surface of the electrodes. The TE waveguide mode (TE0) is mainly distributed in the middle of the structure, i.e. centered at approximately 125 nm from the base of the substrate. The TM waveguide mode (TM0) is mainly distributed outside of the structure.

Given the profile illustrated, the EML (emitter) may be placed in the middle of the structure corresponding with the peak of the TE waveguide mode. Further increasing the thickness of the ETL and HTL, the TE waveguide mode may be promoted while the SPP and TM waveguide modes are suppressed.

The air mode, which is not a polarized emission, is also suppressed. This is achieved by the microcavity length, and EML (emitter) position. In this exemplary embodiment, the optimized condition where both the unwanted trapped modes and the air mode are suppressed may be found by fixing the EML thickness, and tuning the HTL and ETL thickness simultaneously.

Figures 6A, 6B:
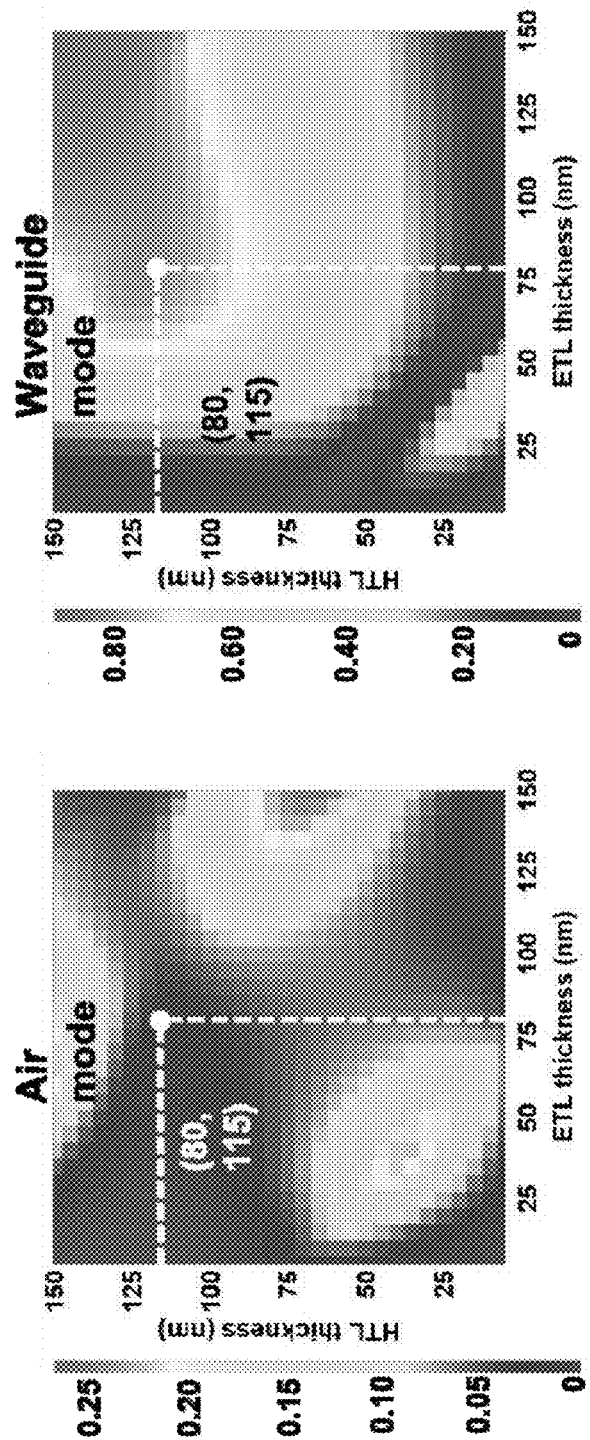
FIG. 6a is a graph of a fraction of air mode trapped in a structure with different layer thicknesses.
FIG. 6b is a graph of a fraction of waveguide mode trapped in a structure with different layer thicknesses.

This optimization task was conducted by using the commercially available software Setfos™. The results of the optimization with the ETL thickness set at 20 nm, and an emission wavelength of 520 nm are depicted in FIGS. 6a and 6b. FIG. 6a is a graph of a fraction of Air mode with different HTL and ETL thicknesses. FIG. 6b is a graph of a fraction of waveguide modes (TE and TM) with different HTL and ETL thicknesses. From the graphs illustrated, when the thickness of the HTL is 115 nm, and the thickness of the ETL is 80 nm, the proportion of the air mode is suppressed to below 3%. Further, with these thicknesses the waveguides modes (TE and TM) are promoted to above 80%.

Figure 7:
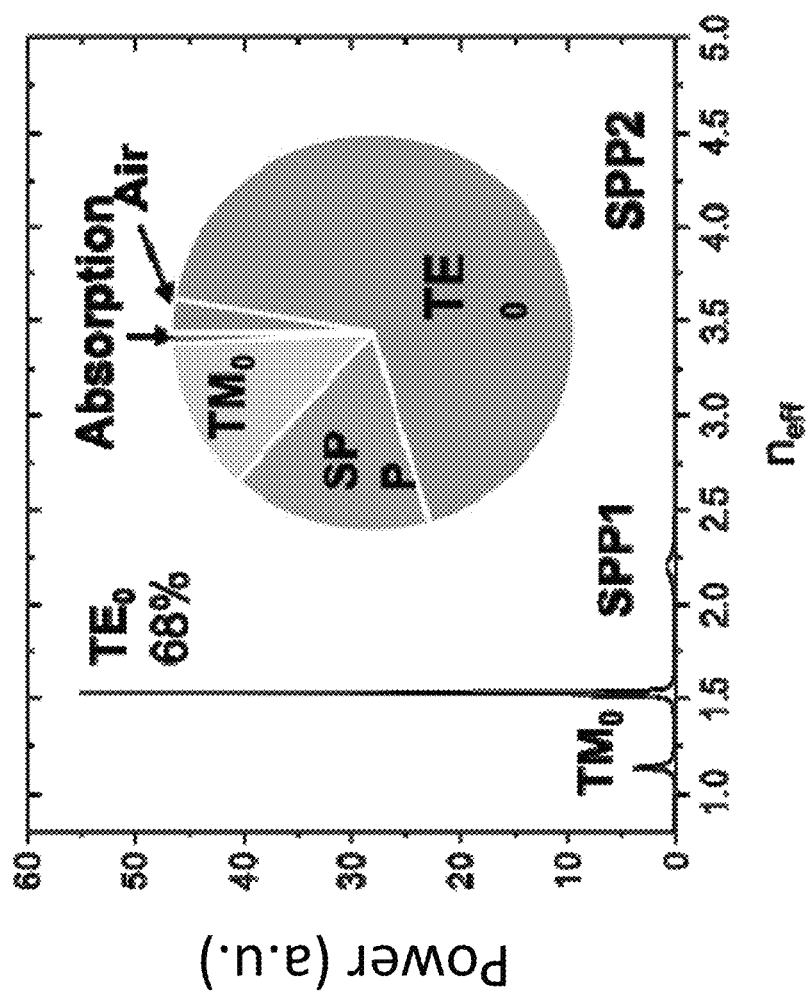
FIG. 7 is a graph of dissipated power against effective index for a structure in accordance with an aspect of the disclosure.

To obtain the proportion of the TE waveguide mode alone, the dissipated power against effective index ($n_{eff}$) in the optimized condition, i.e. HTL 115 nm and ETL 80 nm, is also simulated by Setfos. The results of this simulation are depicted in FIG. 7. FIG. 7 is a graph of dissipated power against effective index for the structure.

In this graph, the corresponding mode of each peak can be identified based on their $n_{eff}$. As expected, the TE waveguide mode (TE0) shows a much higher peak compared to the other modes. By conducting integrations over $n_{eff}$, it can be found that 67% of light is coupled into TE waveguide mode (TE0), indicating the realization of a "single mode" device. Furthermore, by tuning the dipole orientation of the EML (emitter) to be parallel, then over 80% of light can be coupled into the TE waveguide mode (TEO).

The optical component is then incorporated into the structure in the form a 1D grating. The 1D grating takes the form of a corrugated substrate. The resulting structure (structure 1) is used to fabricate a top-emitting LED which demonstrates polarized emission.

Figures 8A, 8B:
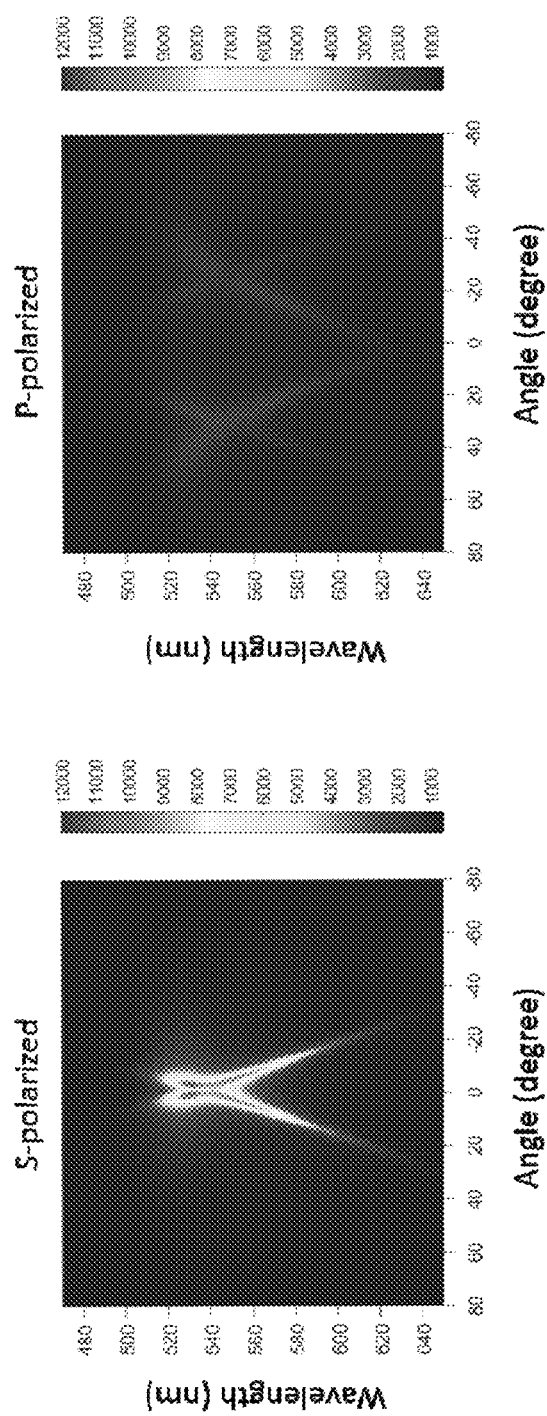
FIGS. 8a-b are graphs of angular-dependent electroluminescence (EL) spectra in S and P-polarization, respectively.

The emission of the LED was experimentally measured, the resulting experimentally measured angular-dependent EL spectra in S and P-polarization is depicted in FIGS. 8*a* and 8*b*, respectively.

The S-polarized light almost solely comes from the diffraction of the TE waveguide mode (TEO). As shown in FIG. 8*a*, the S-polarized has a high intensity manifested by two clearly visible crossed stripes. The P-polarized light is much weaker. This polarized emission is the result of the described optical design which suppresses unwanted modes while promoting the TE waveguide mode.

To evaluate our polarized emission quantitatively, the polarization ratio is also calculated, showing a polarization ratio above 30 in the wavelength range of approximately 530 to 570 nm.

Figure 9B:
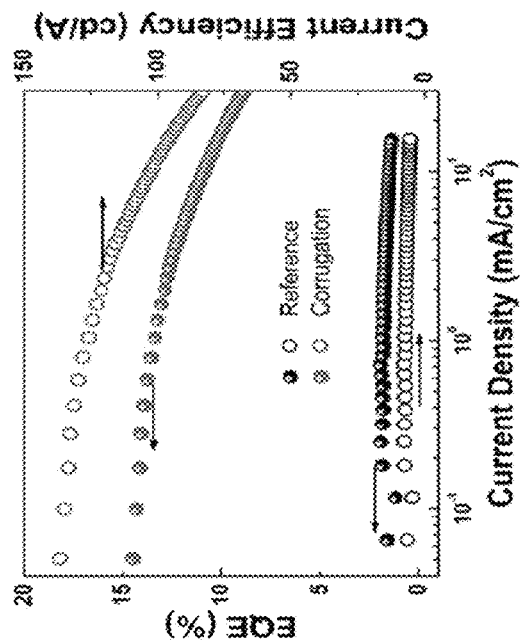
FIG. 9b is a graph of external quantum efficiencies (EQEs) and current efficiencies of reference, and an optical component in accordance with an aspect of the disclosure.
Figure 9A:
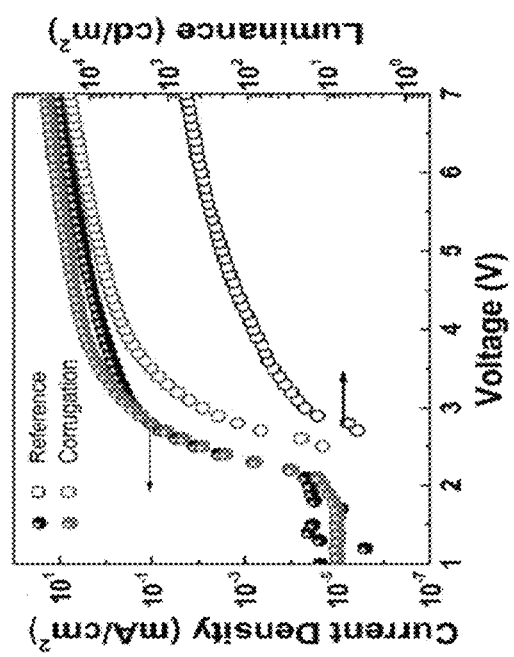
FIG. 9a is a graph of current density-voltage-luminance of an LED in accordance with an aspect of the disclosure.

The EQE of the LED and efficiency may also be determined. To this end the current density-voltage-luminance (J-V-L) curves of the LED are illustrated in FIG. 9*a*. Further the EQEs and current efficiencies of reference, and an optical component (1D grating) are illustrated in FIG. 9*b*. Based on these graphs the EQE of the LED is over 14%. Further the current efficiency is above 130 cd/A. These performance metrics are better than conventional structures and methods of obtaining polarized light while maintaining the form factor required for a wide variety of applications.

While the LED has been described as at least partially promoting the TE waveguide mode, other emissions may alternatively be promoted. For example, the LED may be tuned to at least partially promote the TM waveguide mode, or the SPP mode. References above to the TE waveguide mode may accordingly be replaced with the TM waveguide mode or the SPP mode.

It should be understood that the examples provided are merely exemplary of the present disclosure, and that various modifications may be made thereto.

What is claimed:

1. A light-emitting diode (LED) comprising:
    an emissive layer (EML) positioned between first and second electrodes, wherein the EML is tuned such that emission of a transverse electric (TE) waveguide mode from the EML is promoted;
    an optical component for diffracting the TE waveguide mode to emit light from the LED, the optical component comprising a diffraction grating;
    a substrate upon which the first and second electrodes are positioned with the EML between the first and second electrodes, the substrate forming the diffraction grating, wherein the substrate is a corrugated substrate having a periodic surface relief having a depth of 70 nm;
    an electron transport layer (ETL) positioned between the EML and the first electrode, the ETL having a thickness of 80 nm; and
    a hole transport layer (HTL) positioned between the EML and the second electrode, the HTL having a thickness of 115 nm.

2. A structure for emitting light, the structure comprising:
    an emissive layer (EML) positioned between first and second electrodes, wherein the EML is tuned such that emission of a transverse electric (TE) waveguide mode from the EML is promoted;
    an optical component for diffracting the TE waveguide mode to emit light from the structure, the optical component comprising a diffraction grating;
    a substrate upon which the first and second electrodes are positioned with the EML between the first and second electrodes, the substrate forming the diffraction grating, wherein the substrate is a corrugated substrate having a periodic surface relief having a depth of 70 nm;
    an electron transport layer (ETL) positioned between the EML and the first electrode, the ETL having a thickness of 80 nm; and
    a hole transport layer (HTL) positioned between the EML and the second electrode, the HTL having a thickness of 115 nm.

3. The structure of claim 2, wherein at least one of a position of the EML between the first and second electrodes, a thickness of the EML, EML dipole orientation, and microcavity length is selected such that emission of the TE waveguide mode is promoted.

4. The structure of claim 2, wherein the EML is tuned such that emission of modes other than the TE waveguide mode are suppressed.

5. The structure of claim 4, wherein the other modes other than the TE waveguide mode comprise at least one of air mode, transverse magnetic (TM) waveguide mode, and surface plasmon polariton (SPP) mode.

6. The structure of claim 2, wherein the diffraction grating comprises a 1D diffraction grating.

7. A method comprising:
    tuning an emissive layer (EML) positioned between first and second electrodes of a structure such that emission of a transverse electric (TE) waveguide mode from the EML is promoted, the structure comprising:
    an optical component for diffracting the TE waveguide mode to emit light from the structure, the optical component comprising a diffraction grating;
    a substrate upon which the first and second electrodes are positioned with the EML between the first and second electrodes, the substrate forming the diffraction grating, wherein the substrate is a corrugated substrate having a periodic surface relief having a depth of 70 nm;
    an electron transport layer (ETL) positioned between the EML and the first electrode, the ETL having a thickness of 80 nm; and
    a hole transport layer (HTL) positioned between the EML and the second electrode, the HTL having a thickness of 115 nm.

8. The method of claim 7, wherein tuning the EML comprises determining at least one of a position of the EML between the first and second electrodes, a thickness of the EML, EML dipole orientation, and microcavity length such that the TE waveguide mode is promoted.

9. The method of claim 8, wherein at least one of the position of the EML between the first and second electrodes, the thickness of the EML, the EML dipole orientation, and microcavity length is determined based on a profile of one or more modes emitted by the EML, the modes including the TE waveguide mode.

10. The method of claim 7, wherein tuning the EML comprises tuning the EML such that modes other than the TE waveguide mode are suppressed.

11. The method of claim 10, wherein the modes other than the TE waveguide mode comprise at least one of air mode, transverse magnetic (TM) waveguide mode, and surface plasmon polariton (SPP) mode.

12. The method of claim 7, wherein the diffraction grating is a 1D diffraction grating.

13. The method of claim 12, wherein the second electrode is positioned on the corrugated substrate.

* * * * *